United States Patent [19]
Ohara et al.

[11] Patent Number: 5,904,501
[45] Date of Patent: May 18, 1999

[54] HOLLOW PACKAGE MANUFACTURING METHOD

[75] Inventors: Masatoshi Ohara; Takeo Ogihara; Satoshi Murata; Kenji Uchida; Tsutomu Kubota; Seiji Ichikawa; Tomoaki Hirokawa; Tomoaki Kimura; Taku Sato; Junichi Tanaka, all of Tokyo, Japan

[73] Assignee: NEC Corporation, Tokyo, Japan

[21] Appl. No.: 08/824,459

[22] Filed: Mar. 26, 1997

[30] Foreign Application Priority Data

Mar. 28, 1996 [JP] Japan ................................. 8-073930

[51] Int. Cl.⁶ ......................... H01L 21/44; H01L 21/48; H01L 21/50
[52] U.S. Cl. ..................... 438/118; 438/119; 438/616; 257/704; 257/710; 257/924
[58] Field of Search .................................. 438/118, 119, 438/616; 414/904; 257/704, 710, 924; 174/52.1, 52.2, 52.3, 52.4, 52.5

[56] References Cited

U.S. PATENT DOCUMENTS 5,596,171  1/1997  Harris et al. ............................. 174/52.4
5,635,672  6/1997  Kawaura ................................. 174/52.3

*Primary Examiner*—John Niebling
*Assistant Examiner*—David A. Zarneke
*Attorney, Agent, or Firm*—Sughrue, Mion, Zinn, Macpeak & Seas, PLLC

[57] ABSTRACT

A hollow package manufacturing method includes the adhesive spreading step, the adhesive applying step, and the cap adhering step. In the adhesive spreading step, an adhesive is spread on a circular table to a uniform thickness. In the adhesive applying step, an open end face of a cylindrical cap having a bottom is urged against the circular table to apply the adhesive to the cap. In the cap adhering step, the cap applied with the adhesive is adhered to a case. A hollow package manufacturing apparatus is also disclosed.

7 Claims, 7 Drawing Sheets

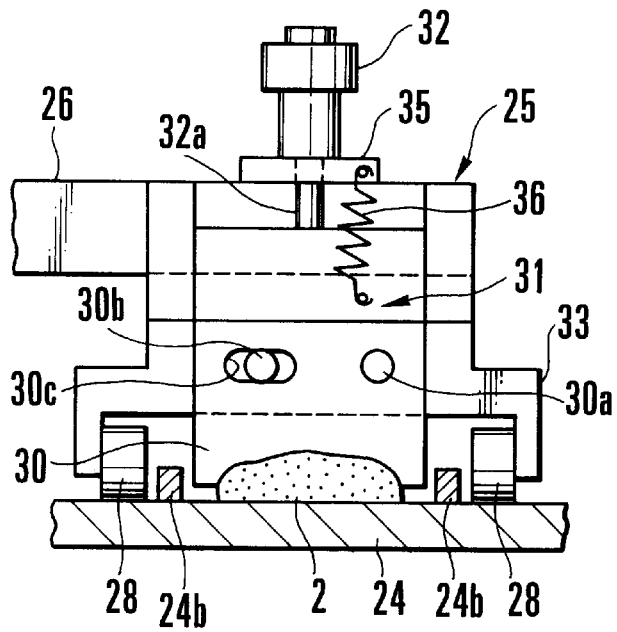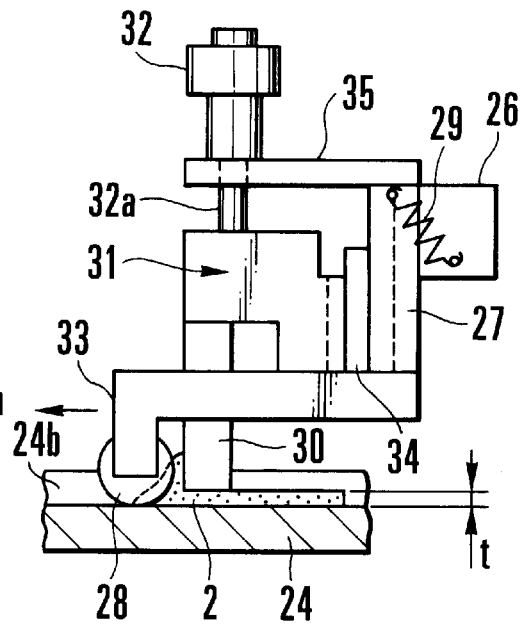
FIG. 3A    FIG. 3B
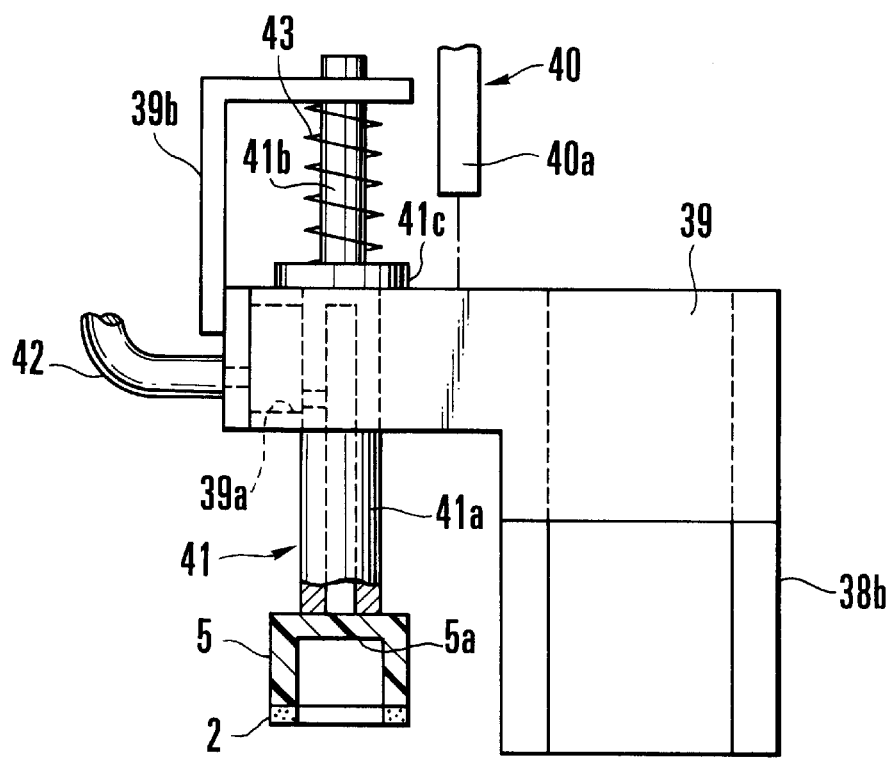
FIG. 4

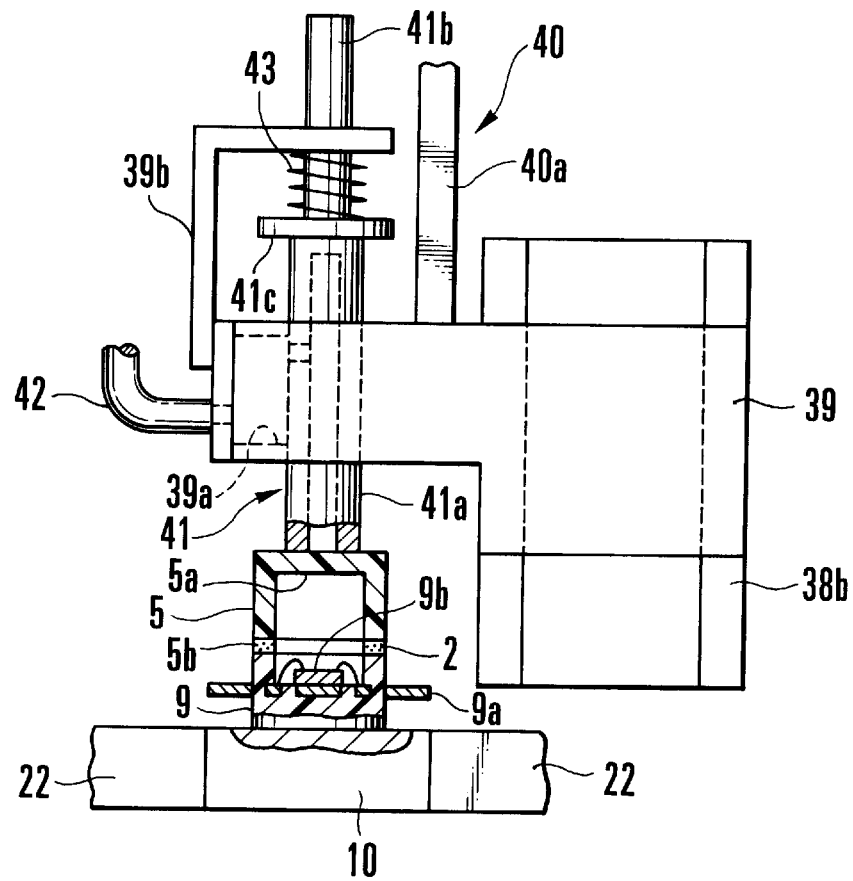
F I G. 5
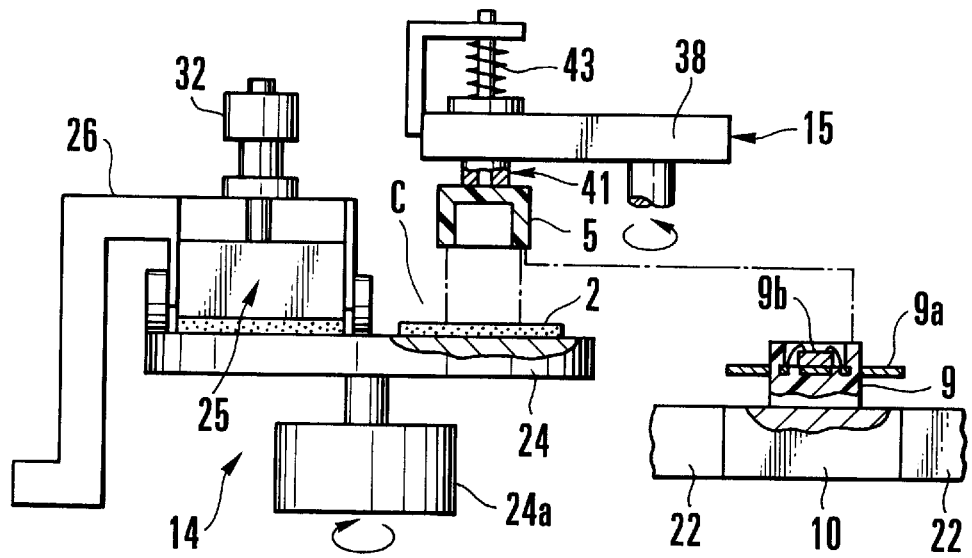
F I G. 6

HOLLOW PACKAGE MANUFACTURING METHOD

BACKGROUND OF THE INVENTION

The present invention relates to a hollow package manufacturing method and apparatus for applying to a hollow package cap an adhesive used for adhering the hollow package cap to a case.

Ultra-high-frequency devices include transistors, ICs, optical elements, surface acoustic wave elements, resonators, and the like. Conventionally, since these devices are used in commercial communication apparatuses and satellites, they must have a high reliability and a long service life even though they may become somewhat expensive. Recently, many ultra-high-frequency devices are also used in home-use apparatuses such as receivers for broadcast satellite communication, portable telephones, and the like. Although devices used for home-use apparatuses do not need such a high reliability and a long service life as those of the commercial communication apparatuses, they must be manufactured at a low cost as much as possible. Among attempts for manufacturing lower-cost devices, an ultra-high-frequency chip conventionally sealed in a ceramic package is incorporated in a hollow package made of a synthetic resins thereby reducing the cost.

A resin-molded package of this type is formed by adhering a cap to a case mounting a semiconductor chip and the like therein. As an adhesive used for adhering the cap to the case, a sheet-like adhesive or a liquid adhesive is used. A conventional method of forming a hollow package by using a liquid adhesive will be described with reference to FIGS. 10A to 10E.

Referring to FIGS. 10A and 10B, reference numeral 1 denotes an adhesive coating unit. The adhesive coating unit 1 spreads a liquid adhesive 2 having a viscosity over the upper surface of a mask 3 with a squeegee 4. A plurality of mask openings 3a having the same shape as that of adhesion surfaces are formed in the mask 3 and are positioned above hollow package caps 5 (to be described later).

The hollow package caps 5 are made of a synthetic resin into cylinders respectively having bottoms and recessed portions 5a, and are held by a tray 6 such that their end faces 5b where the recessed portions 5a are open face upward. The tray 6 holds the caps 5 to face upward at positions corresponding to the mask openings 3a of the mask 3. Each mask opening 3a is formed to have a hole diameter substantially equal to the outer diameter of the cap 5.

Referring to FIG. 10C, reference numeral 7 denotes a heating furnace. Referring to FIG. 10D, reference numeral 8 denotes a vacuum suction nozzle for conveying the cap 5 coated with the adhesive 2 downward. Hollow package cases 9 are formed by molding the synthetic resin on a lead frame 9a. A wire-bonded ultra-high-frequency semiconductor chip 9b is mounted in the hollow package case 9. Referring to FIGS. 10D and 10E, reference numeral 10 denotes a heater plate for heating the placed hollow package case 9. As the synthetic resin that forms the caps 5 and the cases 9, an epoxy resin is employed. As the adhesive 2, one containing an epoxy resin as the major component is used.

In the conventional arrangement described above, to adhere the caps 5 to the hollow package cases 9, first, the adhesive 2 is applied to the end faces 5b of the caps 5 by using the adhesive coating unit 1, as shown in FIGS. 10A to 10C. More specifically, the caps 5 are held by the tray 6 and their open end faces 5b are positioned below the mask openings 3a of the mask 3, and the adhesive 2 is spread over the mask 3 with the squeegee 4. Therefore, the adhesive 2 fills the mask openings 3a of the mask 3 to coat the end faces 5b of the caps 5.

Thereafter, the tray 6 is separated downward from the adhesive coating unit 1. The adhesive 2 coating the end faces 5b of the caps 5 is separated from the adhesive 2 on the surface of the mask 3 to remain in the caps 5. The thickness of the adhesive 2 applied to the open end faces 5b corresponds to the thickness of the mask 3. Accordingly, when the thickness of the mask 3 is changed, the adhesive 2 can be easily applied to a desired thickness As shown in FIG. 10C, the caps 5 are supplied together with the tray 6 into the heating furnace 7 and are heated in order to semi-harden the adhesive 2. This aims at preventing the caps 5 from adhering to each other or from adhering to a transfer vessel (not shown) when the caps 5 are transferred to a following step.

After the caps 5 are extracted from the heating furnace 7, they are loaded in the transfer vessel (not shown) and are transferred to the cap adhering unit shown in FIG. 10D. Subsequently, the caps 5 are extracted from the transfer vessel with a handling unit (not shown) and are aligned to discriminate their vertical and horizontal directions. The bottom surface (a surface opposite to the open end face 5b applied with the adhesive 2) of each cap 5 is drawn with the vacuum suction nozzle 8.

Thereafter, the cap 5 facing downward is conveyed above the case 9 with the vacuum suction nozzle 8, as shown in FIG. 10D, and is urged against the upper surface of the case 9 which has been placed on the heater plate 10 and heated. The adhesive 2 is heated and melted by the heat of the case 9, and is hardened, so that the cap 5 is adhered to the case 9 through the adhesive 2.

When a sheet-like adhesive is used as the adhesive 2, it is cut into the same shape (annular shape) as that of the open end face 5b of the cap 5, and the cut adhesive sheet is adhered to the open end face 5b. Thereafter, the cap 5 is adhered to the case 9 through the adhesive sheet.

The most significant element in the adhesive coating step is how to apply the adhesive in a desired thickness accurately. For example, if the amount of adhesive 2 applied to the cap 5 is smaller than the defined amount, the cap 5 cannot be firmly adhered to the case 9, and moreover the airtightness at the adhesion portion is decreased. Inversely, if the amount of applied adhesive 2 is larger than the defined amount, an excessive adhesive 2 flows into and out of the package to degrade the outer appearance, or attaches to the chip and wires to degrade the electrical characteristics. From these reasons, conventionally, the thickness of the adhesive 2 is strictly managed to fall within a range of 20 $\mu$m to 50 $\mu$m by controlling the thickness of the mask or the thickness of the sheet-like adhesive film.

When, however, the method shown in FIGS. 10A to 10E is employed, the mask opening 3a and the open end face 5b of the cap 5 must be aligned at high precision. The conventional cap 5 has a comparatively large size and thus can be aligned easily. In contrast to this, since the package for an ultra-high-frequency device has a small diameter of 2 mm and its recessed portion-side end face 5b has a small width of 0.25 mm, alignment must be performed with an error of 0.02 mm or less. If misalignment occurs, the liquid adhesive 2 may leak to the outer circumferential portion of the cap 5 through a gap formed by misalignment, or some region of the open end face 5b may be left uncoated with the adhesive 2, leading to a poor outer appearance and a decrease in reliability. From these reasons, a long period of time is required for alignment, and a high-precision, expensive alignment unit is indispensable, increasing the manufacturing cost of the device accordingly.

In this manner, since the adhesive coating unit 1 using the mask 3 has a complicated arrangement, it must be inevitably separated from the cap adhering unit. Therefore, when transferring the caps 5 from the adhesive coating unit 1 to the cap adhering unit, a countermeasure must be taken so that the caps 5 will not adhere to each other or adhere to the transfer vessel. Conventionally, the adhesive 2 coated by the adhesive coating unit 1 is placed in the heating furnace once and is semi-hardened so that its adhesion properties are decreased, and thereafter the caps 5 are transferred.

For this purpose, a heating unit for semi-hardening the adhesive 2, the transfer vessel used for transfer between the steps, the handling unit for transferring the caps 5 to the cap adhering unit, and the like are required. Also, during handling, the caps 5 must be aligned again and their vertical direction and referential direction must be discriminated. Furthermore, when adhering the caps 5, the adhesive 2 must be preheated to restore it from the semi-hardened state to the molten state. In this manner, with the method using the mask 3, although the thickness of the adhesive 2 can be uniformed comparatively easily, expensive units and a large number of steps are required for alignment and handling.

When the sheet-like adhesive is used, although a heating furnace for semi-hardening the adhesive becomes unnecessary, high precision is required in alignment, in the same manner as for alignment of the mask 3. Since the sheet-like adhesive need be attached with parting paper or the like to facilitate its handling, the sheet-like adhesive itself becomes expensive. In the package for the ultra-high-frequency device, since the sheet has a small diameter of 2 mm and a small width of 0.25 mm, even if the sheet is cut circular with a die, when adhering the sheet to the cap 5, the sheet may be deformed to cause misalignment in the adhesion position. As a result, the adhesion strength is decreased, or the airtightness may be decreased.

SUMMARY OF THE INVENTION

It is an object of the present invention to obtain a hollow package manufacturing apparatus and method capable of making constant the amount of adhesive to be applied to the cap.

It is another object of the present invention to obtain a hollow package manufacturing apparatus and method in which a film made of an adhesive is prevented from being formed on the cap.

It is still another object of the present invention to obtain a hollow package manufacturing apparatus and method capable of manufacturing a small hollow package at a low cost.

In order to achieve the above objects, according to the present invention, there is provided a hollow package manufacturing method comprising the steps of spreading an adhesive on an adhesive accepting member to a uniform thickness, urging an open end face of a cylindrical cap having a bottom against the adhesive accepting member to apply the adhesive to the cap, and adhering the cap applied with the adhesive to a case.

BRIEF DESCRIPTION OF THE DRAWINGS

FIGS. 3A and 3B are front and side views, respectively, of a squeegee shown in FIG. 1;

FIG. 4 is a side view of the cap suction portion of a cap placing unit shown in FIG. 1 that conveys a cap;

FIG. 5 is a side view of the cap suction portion of the cap placing unit shown in FIG. 1 that urges a cap against a case;

FIG. 6 is a side view of the arrangement of the main part of the hollow package manufacturing apparatus shown in FIG. 1;

FIGS. 10A to 10E are views for explaining a conventional hollow package manufacturing method, in which FIG. 10A is a plan view for explaining an adhesive coating step, FIG. 10B is a sectional view taken along the line B—B of FIG. 10A, FIG. 10C is a sectional view showing a state after the adhesive is applied, FIG. 10D is a sectional view showing a state wherein a cap is conveyed above a case, and FIG. 10E is a sectional view showing a state of an adhering step.

DESCRIPTION OF THE PREFERRED EMBODIMENTS

The present invention will be described in detail with reference to FIGS. 1 to 7C.

Figure 1:
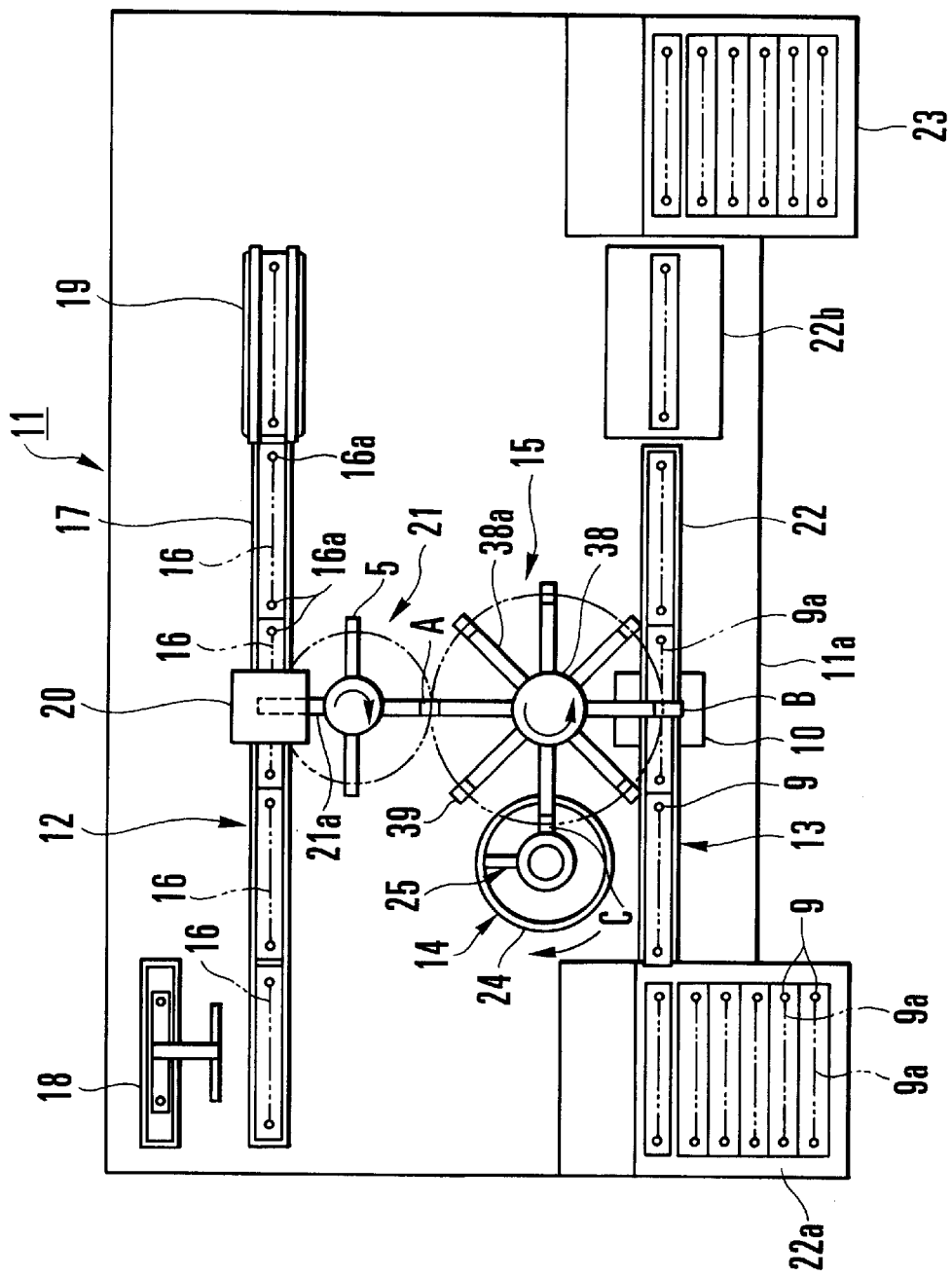
FIG. 1 is a plan view showing the schematic arrangement of a hollow package manufacturing apparatus according to the first embodiment of the present invention.

FIG. 1 shows the schematic arrangement of a hollow package manufacturing apparatus according to the present invention. Referring to FIG. 1, reference numeral 11 denotes a hollow package manufacturing apparatus. The hollow package manufacturing apparatus 11 has a cap supply unit 12 disposed on its one side, a case convey unit 13 disposed on its other side, and an adhesive coating unit 14 and a cap placing unit 15 disposed between the units 12 and 13.

The cap supply unit 12 intermittently feeds a cap frame 16, made of a metal thin plate formed with a large number of caps 5 by molding, to the right in FIG. 1 with a convey rail 17. A large number of round holes 16a are formed in each cap frame 16, and the cylindrical caps 5 each having a bottom are formed on the cap frame 16 by molding such that they partly expose in the round holes 16a. The cap frames 16 are supplied to the convey rail 17 such that the bottom surfaces of the caps 5 face upward (surfaces opposite to surfaces where recessed portions are formed).

A loader 18 formed near the upstream end portion (the left-side end portion in FIG. 1) of the convey rail 17 places the cap frame 16 from a stocker (not shown) to the convey rail 17. An unloader 19 is formed on the downstream end portion of the convey rail 17. A punching unit 20 disposed at the central portion of the convey rail 17 punches the caps 5 from the cap frame 16.

The punching unit 20 punches the caps 5 from the cap frame 16 downward and places them on the distal end portions of arms 21a of a cap transfer unit 21 located below the cap frame 16. The cap transfer unit 21 serves to feed the caps 5 punched from the cap frame 16 to the suction position of the cap placing unit 15 (to be described later), and has the four arms 21a that are arranged at an angular interval of 90° and held rotatable about its vertical axis, i.e., on a horizontal plane. The suction position of the cap placing unit 15 corresponds to a position where the arms 21a are rotated from the punching position of the caps 5 by 180°. This suction position is denoted by reference symbol A in FIG. 1.

Figure 10A:
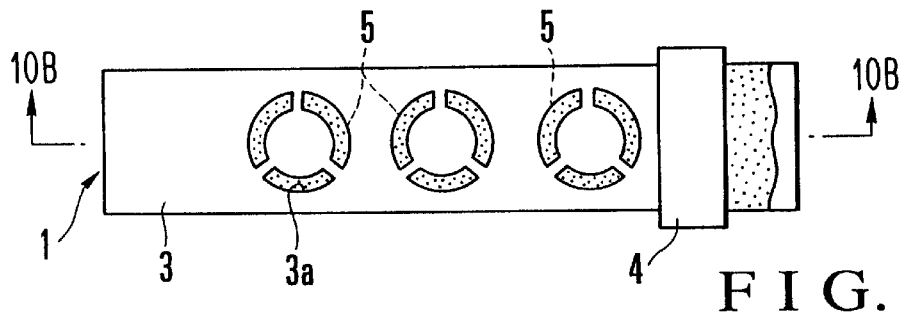
Figure 10B:
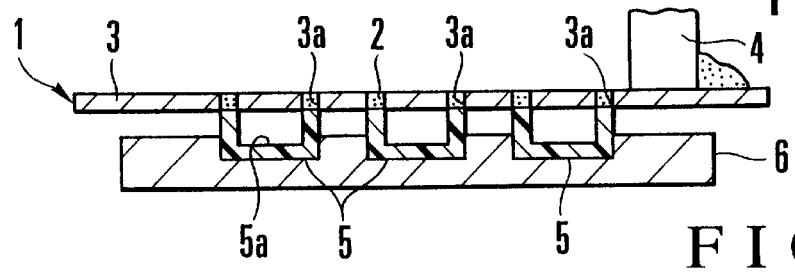
Figure 10C:
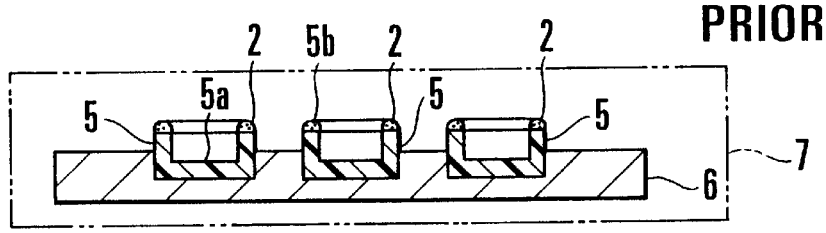
Figure 10D:
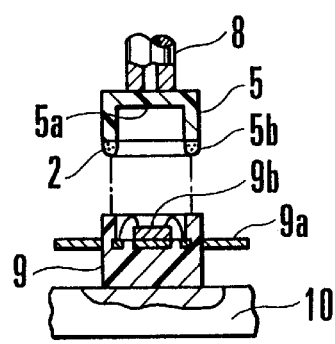
Figure 10E:
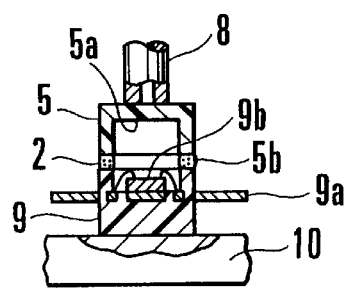

The case convey unit 13 intermittently feeds a lead frame 9a, on which cases 9 are formed by molding, to the right in FIG. 1 with a convey rail 22. The lead frame 9a supplies the cases 9 to the convey rail 22 such that the cap adhesion surfaces of the cases 9 face upward. The hollow package manufacturing apparatus 11 adheres the caps 5 to the cases 9 with the cap placing unit 15 (to be described later) while conveying the lead frame 9a with the case convey unit 13. The adhesion position is denoted by reference symbol B in FIG. 1. Semiconductor chips 9b are mounted on the lead frame 9a and bonded with wires, as shown in FIG. 10D.

A loader 22a for supplying the lead frame 9a to the convey rail 22 is coupled to the upstream end portion of the convey rail 22. A curing unit 22b and a lead frame stocker 23 are sequentially disposed near the downstream end portion of the convey rail 22. To place the lead frame 9a to the curing unit 22b and the lead frame stocker 23, a pawl feed type or suction type placing unit (not shown) is used. A heater plate 10 is disposed midway along the convey rail 22 at a portion serving as the adhesion position B.

Figure 2:
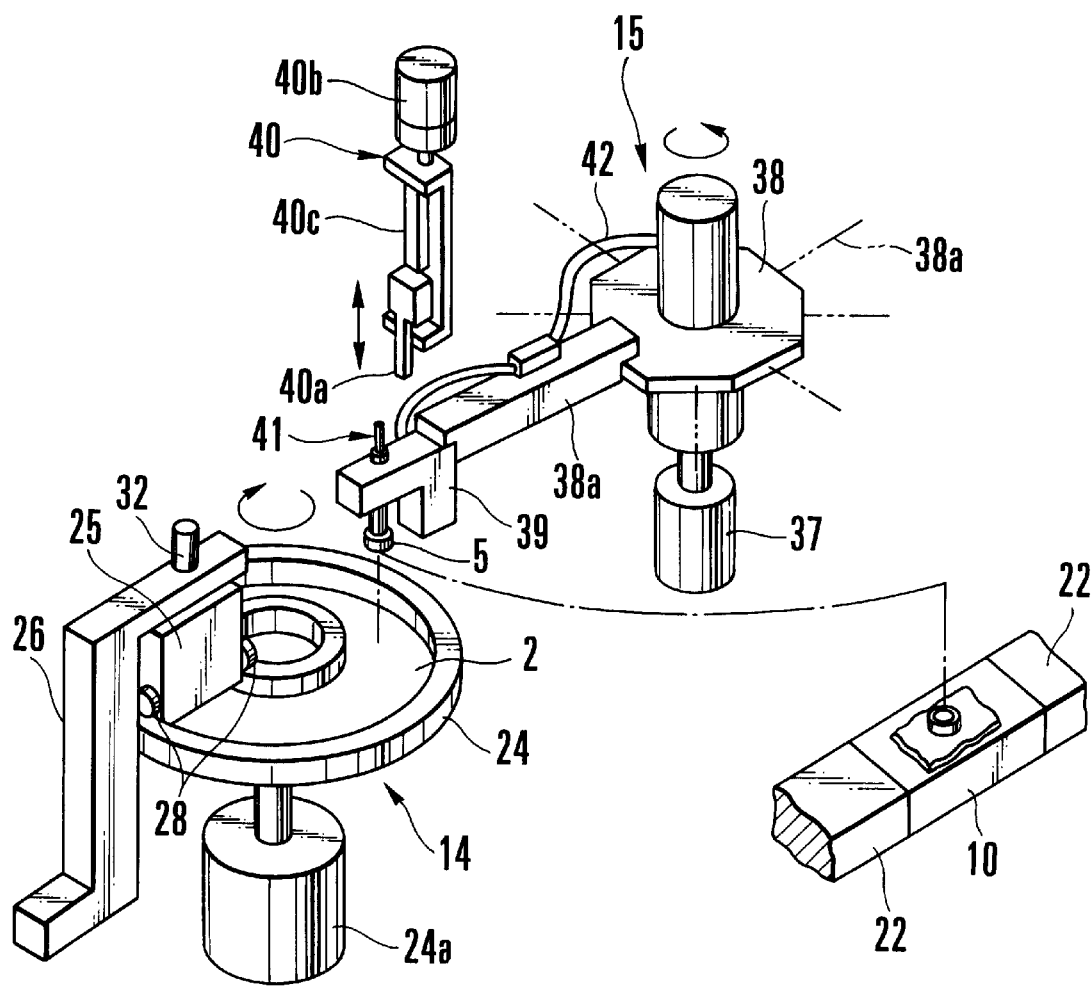
FIG. 2 is a perspective view showing the arrangement of the main part of the hollow package manufacturing apparatus shown in FIG. 1.

As shown in FIG. 2, the adhesive coating unit 14 spreads a liquid adhesive 2 having a viscosity onto a circular table 24 with a squeegee 25. The circular table 24 constitutes an adhesive accepting member according to the present invention. As the adhesive 2, a thermosetting epoxy resin, a thermoplastic epoxy resin, a phenol-based resin, a sealer material, or the like can be used. Such an adhesive 2 is supplied onto the circular table 24 with an adhesive supply unit (not shown). The circular table 24 is formed into a disk and fixedly supported on the rotating shaft of a drive motor 24a.

In this embodiment, a stepping motor is used as the drive motor 24a. When spreading the adhesive 2, the drive motor 24a intermittently rotates the circular table 24 in the direction indicated by an arrow in FIG. 2. When urging the cap 5 against the adhesive 2 spread over the circular table 24 by using the cap placing unit 15, the circular table 24 is stopped. In this embodiment, after the cap 5 is urged against the adhesive 2, the circular table 24 is pivoted by a predetermined angle for the sake of the next cap 5. Every time the circular table 24 is rotated by one revolution, the adhesive 2 is supplied and spread by the squeegee 25.

When continuously urging the caps 5, the adhesive 2 is constantly supplied and spread to a predetermined thickness by the squeegee 25, so that the circular table 24 need not be rotated for spreading the adhesive 2. In other words, the operation of spreading the adhesive and the operation of applying the cap to the adhesive can be performed continuously.

The squeegee 25 is supported by a holder 26 fixed on a base 11a of this hollow package manufacturing apparatus 11 to be vertically movable through a slide guide 27, as shown in FIG. 3B, and rollers 28 rotatably attached at the two sides of the lower end portion of the squeegee 25 are supported on the circular table 24. A helical tension spring 29 for biasing the entire squeegee 25 toward the circular table 24 is elastically mounted between the squeegee 25 and the holder 26. The force for urging the cap 5 against the adhesive 2 is 200 g, and the urging time is 0.5 second.

The squeegee 25 has an adhesive thickness adjusting mechanism for adjusting the thickness of adhesive 2 spread over the circular table 24. This adhesive thickness adjusting mechanism is constituted by a slider 31 having a spatula 30 that comes into contact with the adhesive 2, and a micrometer 32. The slider 31 is coupled to a squeegee main body 33, that supports the rollers 28, to be vertically movable through a slide guide 34, as shown in FIG. 3B. As shown in FIG. 3A, a helical tension spring 36 for biasing the slider 31 upward to urge it against the micrometer 32 (to be described later) is elastically mounted between the slider 31 and a micrometer support plate 35 above the squeegee main body 33.

The spatula 30 of the slider 31 is made of a metal plate having a rectangular shape when seen from the front, and is fixed to the slider 31 with a positioning pin 30a and an eccentric pin 30b. More specifically, when the eccentric pin 30b is rotated, the spatula 30 rotates about the positioning pin 30a as the center, and its lower edge becomes parallel to the adhesive coating surface of the circular table 24. The eccentric pin 30b is fitted in an elongated hole 30c formed in the spatula 30. Referring to FIG. 3A, reference numerals 24b on the two sides of the spatula 30 on the circular table 24 denote a pair of projecting walls 24b that prevent the adhesive 2 from flowing toward the rollers 28 on the circular table 24. The projecting walls 24b are continuously formed in the entire circumferential direction of the circular table 24 without an intermission.

The micrometer 32 is supported such that its spindle 32a extends through the micrometer support plate 35, and the lower end of the spindle 32a abuts against the upper end surface of the slider 31. More specifically, since the slider 31 is urged against the lower end of the spindle 32a with the elastic force of the helical tension spring 36, when the micrometer 32 is operated to increase/decrease the projecting amount of the spindle 32a, a gap t between the lower edge of the spatula 30 and the upper surface of the circular table 24 can be adjusted. The adhesive 2 spread by the squeegee 25 has a thickness corresponding to the gap t. In this embodiment, the thickness of the adhesive 2 spread on the circular table 24 with the squeegee 25 is set to fall within a range of 20 μm to 50 μm.

The schematic arrangement of the cap placing unit 15 is shown in FIG. 2. The cap placing unit 15 is constituted by an armed index table 38, a suction head 39, and a pusher 40. The index table 38 is rotated intermittently by the driving operation of a motor 37. The suction head 39 is coupled to the distal end of each arm 38a of the index table 38 to be vertically movable. The pusher 40 drives the suction head 39. The cap placing unit 15 constitutes the cap holding means according to the present invention. As shown in FIG. 1, a plurality of arms 38a extend radially from the index table 38. In this embodiment, eight arms 38a are formed at equal angular intervals of 45° in the rotational direction of the index table 38.

As shown in FIGS. 4 and 5, each suction head 39 has a suction nozzle 41 for drawing and holding the cap 5 by vacuum suction, and is held by a slide guide 38b formed on the distal end of the corresponding arm 38a to be vertically movable. The suction nozzle 41 constitutes the cap suction unit according to the present invention. A return spring (not shown) is elastically mounted between the suction head 39 and the slide guide 38b to bias the suction head 39 upward and to stop it at the initial position shown in FIG. 4.

The suction nozzle 41 is constituted by a nozzle main body 41a and a guide rod 41b. The nozzle main body 41a extends through and is supported by the suction head 39 to be vertically movable, and is made of a cylinder having a hollow portion. The guide rod 41b is formed at the upper end of the nozzle main body 41a. The hollow portion of the nozzle main body 41a communicates with a vacuum chamber 39a of the suction head 39. When a vacuum pump (not shown) connected to the vacuum chamber 39a through a hose 42 evacuates air, the nozzle main body 41a draws the cap 5 at its lower end by vacuum suction. An opening/closing valve (not shown) is interposed midway along this chucking system, so that the cap 5 can be drawn and released selectively.

The guide rod 41b of the suction nozzle 41 has a collar 41c at its portion connected to the nozzle main body 41a, to oppose the upper surface of the suction head 39. The upper portion of the guide rod 41b extends through a spring stopper 39b, having an inverted L-shaped section of the suction head 39, to be vertically movable. A compression coil spring 43 for biasing the suction nozzle 41 downward is elastically mounted between the spring stopper 39b and the collar 41c.

As shown in FIG. 1, in this hollow package manufacturing apparatus 11, when the index table 38 rotates counterclockwise, the suction nozzle 41 of the suction head 39 moves above the arm 21a of the cap transfer unit 21 that has moved to the suction position A, above the circular table 24 of the adhesive coating unit 14, and above the case 9 on the convey rail 22 which is located at the adhesion position B. When the suction head 39 is located above the circular table 24 (the position of the suction head 39 at this time will be referred to as an adhesive applying position C hereinafter), other suction heads 39 are located at the suction position A and the adhesion position B. In other words, the suction heads 39 are located at the three positions A to C simultaneously.

The distance through which the suction head 39 can move vertically with respect to the arm 38a is set to be larger than the distances among the distal end of the suction nozzle 41, the arm 21a at the suction position A, the circular table 24, and the case 9 at the adhesion position B.

As shown in FIG. 2, the pusher 40 has a structure for vertically moving a push rod 40a with a servo motor 40b, and its frame 40c is attached to the arm 38a of the index table 38 through a bracket (not shown). In the pusher 40, when the push rod 40a is moved downward, it pushes the suction head 39 downward against the elastic forces of the return spring (not shown) and the compression coil spring 43 of the suction nozzle 41 side.

More specifically, when the push rod 40a does not push the suction head 39, the suction head 39 is biased upward by the return spring, as shown in FIG. 4, to be located at the initial position. When the push rod 40a moves downward, the suction head 39 is moved downward, as shown in FIG. 5, against the elastic force of the return spring. At this time, if downward movement of the suction nozzle 41 is regulated, the suction nozzle 41 moves upward with respect to the suction head 39 against the elastic force of the compression coil spring 43 that biases the suction nozzle 41 downward.

In this embodiment, the pushers 40 are provided to all of the eight arms 38a, respectively. However, the pushers 40 may be fixed to the base 11a of the hollow package manufacturing apparatus 11. When the latter arrangement is employed, the pushers 40 may be disposed at three positions, i.e., the suction position A, the adhesion position B, and the adhesive applying position C, respectively.

A hollow package manufacturing method according to the present invention will be described in detail together with the operation of the hollow package manufacturing apparatus 11 described above.

The cap frame 16 is supplied to the convey rail 17 of the cap supply unit 12 shown in FIG. 1, and the caps 5 are conveyed below the punching unit 20. Subsequently, the cap 5 is punched from the cap frame 16 with the punching unit 20, and is placed on the arm 21a of the cap transfer unit 21 located below the cap frame 16. At this time, the cap 5 is placed on the arm 21a such that its bottom surface (a surface opposite to a surface where the recessed portion 5a opens) faces upward.

Thereafter, this arm 21a is pivoted clockwise to move to the suction position A, and the cap 5 is attracted by the cap placing unit 15. The vacuum pump connected to the suction nozzle 41 of the cap placing unit 15 is always set in the operative state while the hollow package manufacturing apparatus 11 is operating. When the opening/closing valve is closed, the cap 5 is released from the suction nozzle 41.

To draw the cap 5 with the cap placing unit 15 by vacuum suction, the suction head 39 is located at the suction position A. The suction head 39 is moved downward by the pusher 40 to urge the nozzle main body 41a of the suction nozzle 41 from above against the bottom surface of the cap 5 located below the nozzle main body 41a. When the nozzle main body 41a abuts against the bottom surface of the cap 5, even if the suction head 39 continuously moves downward, since the compression coil spring 43 is compressed, the suction nozzle 41 stops its downward movement. In other words, the suction nozzle 41 is urged against the cap 5 with a pressure corresponding to the elastic force of the compression coil spring 43.

After the cap 5 is drawn by the suction nozzle 41 by vacuum suction in this manner, the push rod 40a of the pusher 40 is moved upward, so that the suction head 39 is restored to the initial position by the elastic force of the return spring. Subsequently, the index table 38 is rotated counterclockwise to position the suction head 39 above the circular table 24 (at the adhesive applying position C) of the adhesive coating unit 14.

The adhesive coating unit 14 rotates the circular table 24 supplied with the adhesive 2 to spread the adhesive 2 over the circular table 24 in advance. When spreading the adhesive 2, the gap t is adjusted to the predetermined value with the micrometer 32. Then, the adhesive 2 is spread on the circular table 24 to a uniform thickness corresponding to the gap t.

Figure 7A:
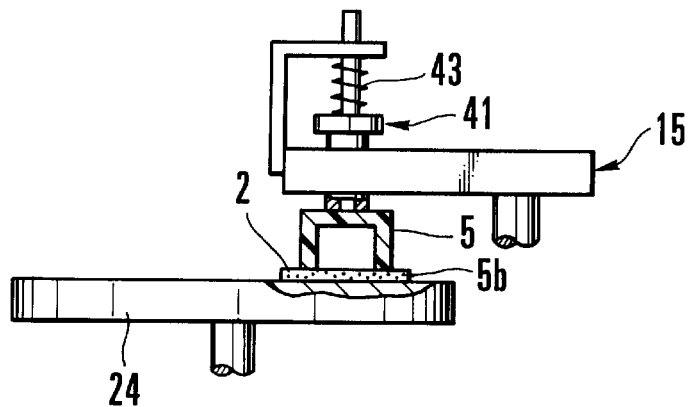
FIG. 7A is a sectional view showing a state wherein a cap is urged against an adhesive.
Figure 7B:
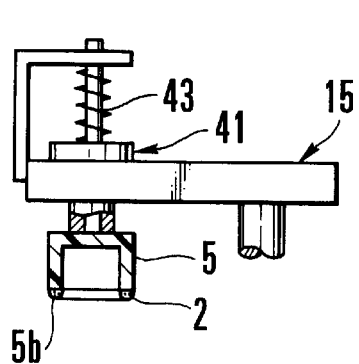
FIG. 7B is a sectional view showing a state wherein the cap is being conveyed.
Figure 7C:
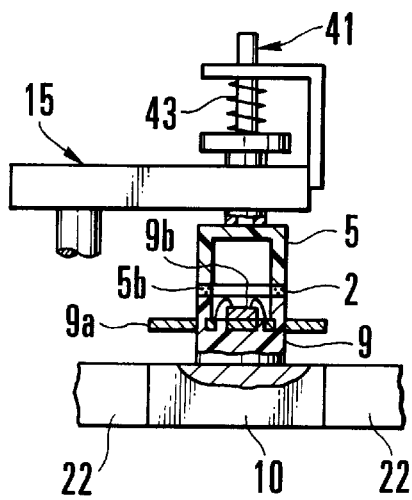
FIG. 7C is a sectional view showing a state wherein the cap is being adhered to a case.

After the suction head 39 is positioned at the adhesive applying position C, the suction head 39 is pushed downward by the pusher 40 to urge the open end face 5b of the cap 5 against the adhesive 2. When the cap 5 is urged against the adhesive 2 and the downward movement of the suction nozzle 41 is regulated, the compression coil spring 43 is compressed. Thus, the cap 5 is urged against the adhesive 2 with a pressure corresponding to the elastic force of the compression coil spring 43. FIG. 7A shows a state wherein the cap 5 is urged against the adhesive 2. In FIGS. 7A to 7C, the arrangement of the index table 38 is simplified for the sake of easy understanding of the respective steps.

After the cap 5 is urged against the adhesive 2 for a predetermined period of time, the push rod 40a of the pusher 40 is moved upward to restore the suction head 39 to the initial position, as shown in FIGS. 4 and 7B. At this time, the cap 5 also moves upward together with the suction head 39. The adhesive 2 which is in contact with the open end face 5b of the cap 5 separates from the adhesive 2 on the circular table 24 to attach to the cap 5.

The suction head 39 is further rotated counterclockwise to position the suction head 39 at the adhesion position B. Before these steps are ended, the case 9 is conveyed to the adhesion position B by the case convey unit 13. The case 9 is heated by the heater plate 10 in advance, and the suction head 39 is pushed downward by the pusher 40, so that the open end face 5b of the cap 5 adheres to the case 9 through the adhesive 2, as shown in FIGS. 5 and 7C. Also at this time, the cap 5 is urged against the case 9 with a pressure corresponding to the elastic force of the compression coil spring 43. In this embodiment, the pressure is 200 g, the pressing time is 0.6 second, and the heating temperature is 250° C. However, these conditions change depending on the types of the adhesive 2. After adhesion, the case 9 is heated by the heater plate 10 to harden the adhesive 2.

After the cap 5 is adhered to the case 9 in this manner, suction by the suction nozzle 41 is stopped. The push rod 40a of the pusher 40 is moved upward to restore the suction head 39 to the initial position. At this time, the cap 5 separates from the suction nozzle 41 and is kept adhered to the case 9.

The series of cap adhering steps described above are performed by all the suction heads 39 of the index table 38 in the same manner. After the step of urging the cap 5 against the adhesive 2 is ended, the adhesive coating unit 14 rotates the circular table 24 by a predetermined angle stepwise. After the circular table 24 is rotated by one revolution by a plurality of times of adhering operations, the adhesive coating unit 14 performs the operation of spreading the adhesive 2 again. The operation of attracting the cap 5 at the suction position A, the operation of adhering the cap 5 to the case 9 at the adhesion position B, and the operation of applying the adhesive 2 to the cap 5 at the adhesive applying position C are performed substantially simultaneously by the suction heads 39 located at the respective positions, as shown in FIG. 1.

After the caps 5 are adhered to all the cases 9 of the lead frame 9a at the adhesion position B, this lead frame 9a is placed onto the curing unit 22b by the pawl feed type or suction type placing unit (not shown). Subsequently, the cases 9 of the curing unit 22b are cured by heating at a temperature lower than that of the heater plate 10, e.g., 165° C., thereby completely hardening the epoxy resin which is the material of the adhesive 2. After the adhesive 2 is hardened in this manner, the lead frame 9a is placed onto the lead frame stocker 23. When the lead frame 9a is placed onto the lead frame stocker 23, all the steps of the hollow package manufacturing apparatus 11 are ended.

As described above, according to the hollow package manufacturing method using the hollow package manufacturing apparatus 11, the adhesive 2 is spread on the circular table 24 to a uniform thickness with the squeegee 25. Then, the recessed portion side end face 5b of the cap 5 is urged against the adhesive 2. After the cap 5 is separated from the circular table 24, it is adhered to the case 9. Accordingly, the adhesive 2 adheres to the cap 5 to a thickness with which it has been spread on the circular table 24.

The hollow package manufacturing apparatus 11 has the circular table 24 for applying the adhesive 2, the squeegee 25 for spreading the adhesive 2 over the circular table 24 to a uniform thickness, and the cap placing unit 15 for holding the cap 5 by vacuum suction, urging the open end face 5b of the cap 5 against the adhesive 2 on the circular table 24, and conveying the cap 5 to the case 9. Therefore, all the steps starting with the step of applying the adhesive 2 to the cap 5 and ended with the step of adhering the cap 5 to the case 9 can be realized with an apparatus smaller than the conventional apparatus in a smaller number of steps within a short period of time. When applying the adhesive 2 to the cap 5, the hollow package manufacturing apparatus 11 need not use a member dependant on the shape and size of the cap 5.

Furthermore, the hollow package manufacturing apparatus 11 rotates the circular table 24 with respect to the squeegee 25, and the squeegee 25 is provided with the adhesive thickness adjusting mechanism that changes the distance with respect to the adhesive coating surface of the circular table 24. Therefore, the drive system for spreading the adhesive 2 and the adhesive thickness adjusting mechanism for adjusting the thickness of the adhesive 2 can be formed separately. Hence, the drive motor 24a for rotating the circular table 24, and the squeegee 25 can have simple arrangements.

Since the suction nozzle 41 of the cap placing unit 15 is biased toward the cap urging side with the compression coil spring 43, the cap 5 is urged against the adhesive 2 with the pressure corresponding to the elastic force of the compression coil spring 43. Thus, the load during application of the adhesive can be set to an optimum value even with a simple arrangement. With this arrangement, when drawing the cap 5 with the suction nozzle 41 by vacuum suction or when adhering the cap 5 to the case 9, the compression coil spring 43 serves as a buffer so that an excessive load will not act.

Figure 8A:
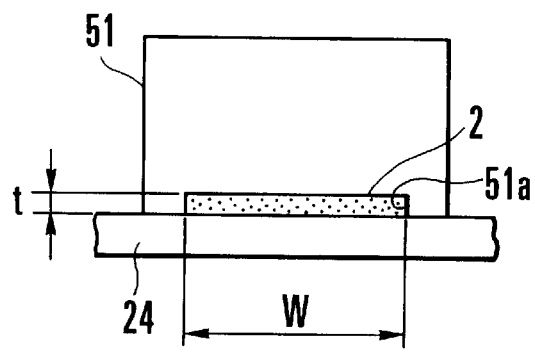
FIGS. 8A and 8B are front and sectional views, respectively, of a squeegee according to the second embodiment of the present invention.
Figure 8B:
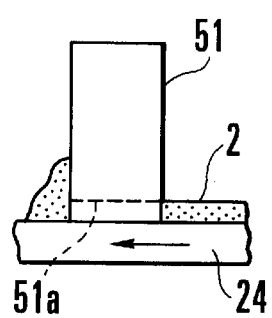

FIGS. 8A and 8B show the second embodiment of the present invention, which is a modification of the squeegee. Referring to FIGS. 8A and 8B, members that are identical or equivalent to those described with reference to FIGS. 1 to 7C are denoted by the same reference numerals, and a detailed description thereof will be omitted.

A squeegee 51 shown in FIGS. 8A and 8B is formed with a metal block and has a groove 51a having a width W and a depth t at its lower end. In place of the groove 51a, projections having a height t may be formed at least at two portions of the lower end of the squeegee 51. The depth t or the height t is set to 20 $\mu$m to 50 $\mu$m. The squeegee 51 is fixed to a base (not shown), in the same manner as the squeegee 25 of the hollow package manufacturing apparatus 11 shown in FIGS. 1 to 7C.

While the squeegee 51 is in contact with the adhesive coating surface of a circular table 24, an adhesive 2 is supplied onto the circular table 24, and the circular table 24, so that the adhesive 2 is spread on the circular table 24 to a thickness corresponding to the depth t of the groove 51a. When this squeegee 51 is employed in the hollow package manufacturing apparatus 11 shown in FIGS. 1 to 7C, a similar effect can be obtained with a mechanism simpler than that of the first embodiment.

FIGS. 9A to 9D show the third embodiment of the present invention, which is a modification of the circular table. Referring to FIGS. 9A to 9D, members that are identical or equivalent to those described with reference to FIGS. 1 to 7C are denoted by the same reference numerals, and a detailed description thereof will be omitted.

A circular table 24 shown in FIGS. 9A to 9D is formed with annular grooves 52 at three portions of its upper surface which is to be coated with an adhesive 2. The grooves 52 are formed into substantially the same shape as those of open end faces 5b of caps 5 and are located at positions that equally divide the circular table 24 into three portions in the circumferential direction. In order to accurately position the grooves 52 formed in the circular table 24 at an adhesive applying position C, in this embodiment, a light-shielding plate 53 formed at the reference position under the outer circumferential portion of the circular table 24 is detected by a position sensor 54 comprising a light-emitting element and a light-receiving element, and this circular table 24 is rotated by a stepping motor 55 stepwise by a ⅓ revolution from the reference position. Then, each groove 52 is positioned at the adhesive applying position C.

A squeegee 56 shown in FIGS. 9A to 9D has a flat lower end, and the entire portion of its lower end is in contact with the adhesive coating surface of the circular table 24. This squeegee 56 is also fixed to a base (not shown), in the same manner as the squeegee 25 of the hollow package manufacturing apparatus 11 shown in FIGS. 1 to 7C.

Figure 9A:
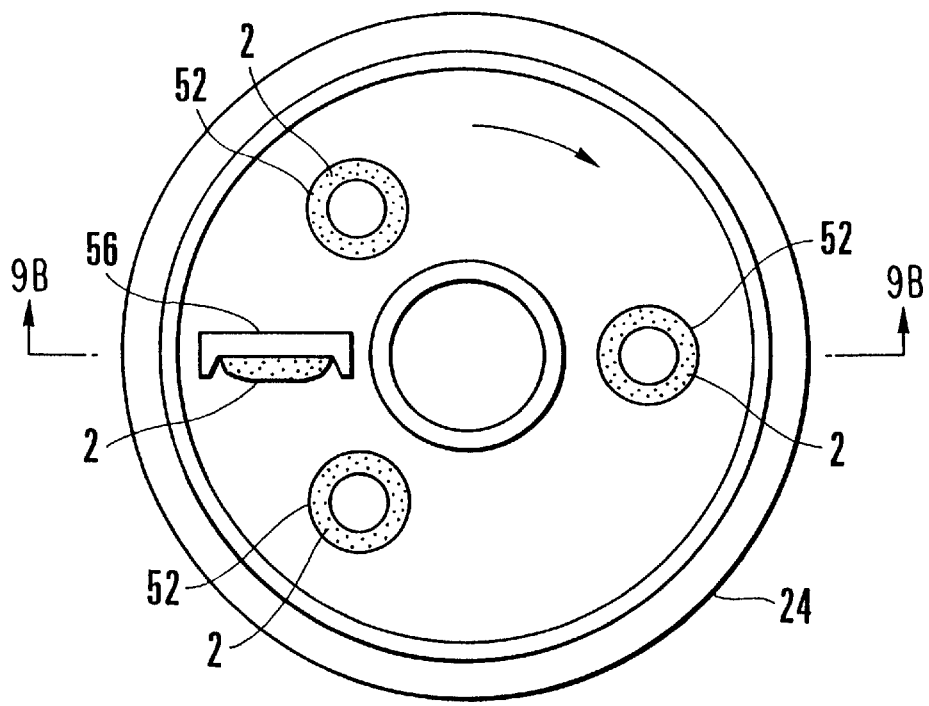
FIG. 9A is a plan view of a rotary table showing the third embodiment of the present invention.
Figure 9B:
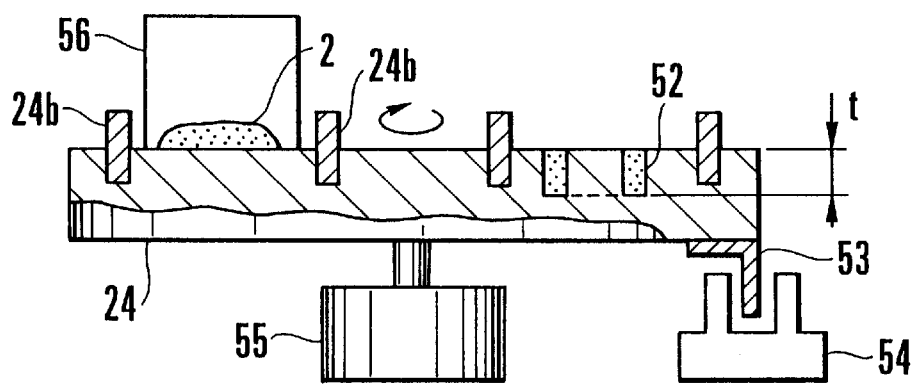
FIG. 9B is a sectional view taken along the line B—B of FIG. 9A.

A procedure of applying the adhesive 2 to the cap 5 by using the circular table 24 formed with the grooves 52 in the above manner will be described. First, the adhesive 2 is supplied to the circular table 24 with an adhesive supply unit (not shown). As shown in FIGS. 9A and 9B, the circular table 24 is rotated clockwise by the stepping motor 55. Hence, when the grooves 52 pass below the squeegee 56, the adhesive 2 fills them.

Figure 9C:
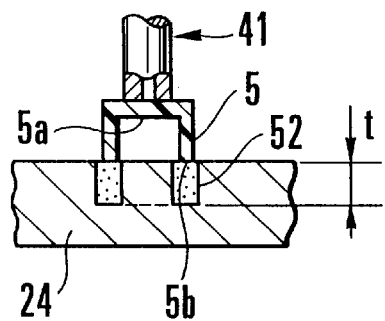
FIG. 9C is a sectional view showing a state wherein a cap is brought into contact with an adhesive in the groove of the rotary table.
Figure 9D:
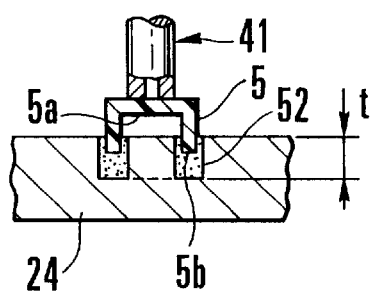
FIG. 9D is a sectional view showing a state wherein the cap is buried in the adhesive in the groove of the rotary table.

After the adhesive 2 fills all the grooves 52, one groove 52 is positioned at the adhesive applying position C. The open end face 5b of the cap 5 is abutted against the surface of the adhesive 2 in the groove 52 from above, as shown in FIG. 9C. As shown in FIG. 9D, the open end face 5b of the cap 5 is urged against the adhesive 2 to sink in the groove 52. At this time, a pressure comprising the elastic force of a compression coil spring 43 identical to that shown in FIG. 4 is applied to the cap 5. Thus, the adhesive 2 coats the open end face 5b of the cap 5 to a thickness corresponding to the depth t of the recessed portion.

If the depth t of the recessed portion is set larger than the thickness of the adhesive 2, the coating thickness of the adhesive 2 can be adjusted by controlling the sinking amount of the cap 5.

After the cap 5 is urged against the adhesive 2 in this manner, the cap 5 is separated upward from the circular table 24, and is adhered to a case 9 in accordance with the same procedure as that of the first embodiment. In the initial stage of the adhesive spreading operation, the adhesive 2 is charged and the circular table 24 is rotated by one revolution or more to uniformly fill the grooves 52 with the adhesive 2. After the step of urging the cap 5 is ended, the circular table 24 is rotated by a ⅓ revolution while filling the adhesive 2, to position the adjacent groove 52 at the adhesive applying position C. The next cap 5 is urged against the adhesive 2 in this groove 52. This operation is repeated continuously. Every time the cap 5 is urged against the corresponding one of all the grooves 52, the adhesive 2 is charged and the circular table 24 is rotated by one revolution or more to fill the grooves 52.

In the first and second embodiments, when the outer shape of the cap 5 becomes smaller, a film may sometimes be formed in the opening of the recessed portion 5a with the surface tension of the adhesive 2. In the third embodiment, when applying the adhesive 2 to the cap 5, the adhesive 2 does not exist in a portion of the cap 5 corresponding to the opening of the recessed portion 5a, so that a film made of the adhesive 2 does not close the opening of the cap 5.

Since the adhesive 2 that coats the cap 5 is formed into a shape corresponding to the shape of the groove 52, the amount of adhesive 2 coating the cap 5 can be changed by exchanging the circular table 24 for one with grooves 52 having different width and depth. The amount of adhesive 2 can also be changed by controlling the sinking amount of the cap 5.

In the embodiments described above, when spreading the adhesive 2 on the circular table 24, the circular table 24 is rotated. However, the circular table 24 may be fixed, and the squeegee 4, 51, or 56 may be rotated. In this case, the table on which the adhesive 2 is to be spread may be formed linearly, and the squeegee may be reciprocally moved on this table. In the embodiments described above, the cap 5 is made of a synthetic resin. However, the present invention can be widely applied to caps made of a ceramic, a metal, or glass.

As has been described above, according to the present invention, a predetermined amount of adhesive can be applied to the cap without using a mask. For this reason, the amount of adhesive will not become smaller than the defined amount, or the position to be coated with the adhesive will not shift, and the cap is firmly adhered to the case, thereby manufacturing a highly airtight hollow package. The adhesive will not be squeezed from the mask to degrade the outer appearance, or will not attach to the chip to degrade the electrical characteristics. In the conventional mask type adhesive coating method, a high-precision mask aligning unit, a heating furnace for semi-hardening the adhesive, a vessel and a convey means for transferring the cap to an adhering step, a cap direction identifying unit for handling the cap in the adhering step again, and the like are necessary. However, these units and steps can be eliminated, thereby greatly decreasing the manufacturing cost of the hollow package.

The thickness of an adhesive can be controlled accurately with a simple arrangement, so that the cost will not be increased. Since the step of removing a film made of an adhesive and formed in the opening of the cap can be omitted, the manufacturing time can be shortened. Since a film is not formed in the opening of the cap, when adhering the cap to the case, an excessive adhesive will not flow into the package, so that a high-quality hollow package can be manufactured. Since the adhesive can be applied to the cap and the resultant cap can be adhered to the case with the same handling unit, the manufacturing steps can be greatly decreased when compared to the conventional method.

Since the manufacture of the hollow package can be automated, a predetermined amount of adhesive can be applied to the cap, so that a high-quality hollow package can be manufactured at a low cost. When applying the adhesive to the cap, a member, such as a mask, which is dependent on the shape and size of the cap need not be used. Thus, even if a relatively smaller-diameter cap is used to manufacture a hollow package that can achieve high-density mounting, the cost will not be increased. Since the drive system for spreading the adhesive and the adhesive thickness adjusting mechanism for adjusting the thickness of the adhesive can be formed separately, a hollow package manufacturing apparatus can be fabricated at a low cost by a combination of simple units.

What is claimed is:

1. A hollow package manufacturing method comprising the steps of:

supplying an adhesive accepting member having a groove formed in an adhesive coating surface;

filling said groove of said adhesive accepting member with an adhesive to a uniform thickness;

urging an open end face of a cylindrical cap having a bottom against said adhesive in said groove to apply said adhesive to the cap, wherein said groove having substantially the same shape as that of the open end face of the cap; and adhering the cap applied with said adhesive to a case.

2. A method according to claim 1, wherein the step of spreading said adhesive comprises the step of spreading said adhesive on said adhesive accepting member to the uniform thickness with a squeegee.

3. A method according to claim 2, wherein the step of spreading said adhesive comprises the step of rotating said adhesive accepting member, thereby spreading said adhesive to the uniform thickness with said squeegee which is fixed.

4. A method according to claim 1, wherein the step of urging a following cap against said adhesive accepting member and the step of adhering a preceding cap to the case are performed almost simultaneously.

5. A method according to claim 1, further a comprising the step of holding the cap on a convey path with a cap placing unit that moves and positions the cap, the step of moving the held cap onto said adhesive accepting member with said cap placing unit and positioning the cap, and the step of moving the positioned cap downward toward said adhesive accepting member spread with said adhesive, thereby applying said adhesive to the open end face of the cap.

6. A method according to claim 1, further comprising the step of moving the cap applied with said adhesive onto the case on said convey path with said cap placing unit and positioning the cap, and the step of moving the positioned cap downward toward the case, thereby adhering the cap applied with said adhesive to the case.

7. A method according to claim 1, further comprising the step of, after applying said adhesive to the cap a predetermined number of times, supplying an adhesive to said adhesive accepting member and spreading said adhesive to a uniform thickness again.

\* \* \* \* \*